(12) United States Patent
Schulze et al.

(10) Patent No.: US 10,077,784 B2
(45) Date of Patent: Sep. 18, 2018

(54) FAN MODULE

(71) Applicant: Hewlett-Packard Development Company, L.P., Houston, TX (US)

(72) Inventors: James Jeffery Schulze, Houston, TX (US); Troy Anthony Della Fiora, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 300 days.

(21) Appl. No.: 14/900,078

(22) PCT Filed: Jun. 25, 2013

(86) PCT No.: PCT/US2013/047504
§ 371 (c)(1),
(2) Date: Dec. 18, 2015

(87) PCT Pub. No.: WO2014/209275
PCT Pub. Date: Dec. 31, 2014

(65) Prior Publication Data
US 2016/0146218 A1 May 26, 2016

(51) Int. Cl.
*F04D 29/54* (2006.01)
*F04D 29/56* (2006.01)
(Continued)

(52) U.S. Cl.
CPC ......... *F04D 29/563* (2013.01); *F04D 19/007* (2013.01); *F04D 25/08* (2013.01);
(Continued)

(58) Field of Classification Search
CPC .... F04D 27/002; F04D 25/541; F04D 25/545; F04D 25/563; H05K 7/20145; H05K 27/20172
See application file for complete search history.

(56) References Cited

U.S. PATENT DOCUMENTS 1,616,566 A * 2/1927 Barker ................... B02C 17/18
209/143
3,095,799 A * 7/1963 Pratt ......................... F24F 1/00
454/322
(Continued)

FOREIGN PATENT DOCUMENTS

CN 2483603 3/2002
CN 201093530 Y 7/2008
(Continued)

OTHER PUBLICATIONS

Automatic Spring-Loaded Air Baffles to Eliminate Air Row Bypass Through a DIMM Connector; http://ip.com/IPCOM/000171717>; Jun. 17, 2008.
(Continued)

*Primary Examiner* — Ninh H Nguyen
(74) *Attorney, Agent, or Firm* — Hewlett Packard Enterprise Patent Department

(57) ABSTRACT

A fan module is provided herein. The fan module includes a fan, a fan diverter, and a guide pin. The fan diverter is formed in the fan module. The fan diverter includes a diverter wall and a torsion spring along the diverter wall to position the diverter wall. The guide pin is connected to the diverter wall. The guide pin is formed to engage with a guide path formed along a chassis bay to position the diverter wall.

19 Claims, 10 Drawing Sheets

(51) Int. Cl.

| | | |
|---|---|---|
| *F04D 25/08* | (2006.01) | |
| *F04D 19/00* | (2006.01) | |
| *H05K 7/20* | (2006.01) | |
| *F04D 27/00* | (2006.01) | |
| *F04D 29/32* | (2006.01) | |
| *F04D 29/52* | (2006.01) | |
| *F24F 11/00* | (2018.01) | |

(52) U.S. Cl.
CPC ......... *F04D 27/002* (2013.01); *F04D 29/325* (2013.01); *F04D 29/522* (2013.01); *F04D 29/545* (2013.01); *H05K 7/20145* (2013.01); *H05K 7/20172* (2013.01); *F24F 2011/0006* (2013.01)

(56) References Cited

U.S. PATENT DOCUMENTS

| | | | |
|---|---|---|---|
| 4,326,452 A | | 4/1982 | Nawa et al. |
| 4,730,771 A | * | 3/1988 | Shepherd ................ F24D 5/04 236/13 |
| 6,816,371 B2 | | 11/2004 | Agata et al. |
| 7,120,018 B2 | | 10/2006 | Shen et al. |
| 7,515,411 B2 | | 4/2009 | Woolsey et al. |
| 8,197,193 B2 | * | 6/2012 | Messmer ............... F04D 27/003 415/126 |
| 8,301,316 B2 | | 10/2012 | Tai et al. |
| 2012/0111533 A1 | | 5/2012 | Chen et al. |

FOREIGN PATENT DOCUMENTS

| | | |
|---|---|---|
| CN | 201331161 | 10/2009 |
| CN | 101832280 | 9/2010 |
| CN | 201724355 | 1/2011 |
| EP | 0780642 | 6/1997 |
| JP | 04148151 | 5/1992 |
| JP | 2004183958 | 7/2004 |
| WO | WO-2005054755 | 6/2005 |

OTHER PUBLICATIONS

PCT/ISR/KR, International Search Report, dated Mar. 25, 2014, PCT/2013/047504, 9 pps.

* cited by examiner

FAN MODULE

BACKGROUND

Electronic devices have temperature requirements. Heat from the use of the electronic devices is controlled using cooling systems. Examples of cooling systems include air cooling systems that use fans.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Electronic system designs balance conflicts between power density, spatial layout, temperature requirements, acoustic noise, and other factors. Air cooling systems typically use heat sinks and fans to remove "waste" heat from the system. Air flow diverters may be used with the fans to push or pull the air in different directions and control the amount of air provided to the electronic system. The fans and air flow diverters typically form a fan module that is installed in the electronic system. The air flow diverters include a wall that is typically fixed to direct and control the air flow in one direction. For example, each fan module includes an air flow diverter to provide air flow in one direction or a specific percent of air flow from zero percent to one hundred percent in one or multiple directions.

In examples, a fan module is provided. The fan module includes a fan, a fan diverter, and a guide pin. The fan diverter is formed in the fan module. The fan diverter includes a diverter wall and a torsion spring along the diverter wall to position the diverter wall. The guide pin is connected to the diverter wall. The guide pin is formed to engage with a guide path formed along a chassis bay to position the diverter wall.

The fan diverter is a self-adjusting diverter with a path determined by the guide path that is interchangeably inserted into the chassis bay. A single fan module may be used with multiple guide paths to provide fan modules that direct air flow in one direction or a specific percent of air flow from zero percent to one hundred percent in one or multiple directions. Using a single fan module, eliminates the need to manufacture multiple fan modules and instead only requires the manufacturing of a variety of guide paths that can be inserted into a chassis bay when the electronic system in assembled.

Figure 1:
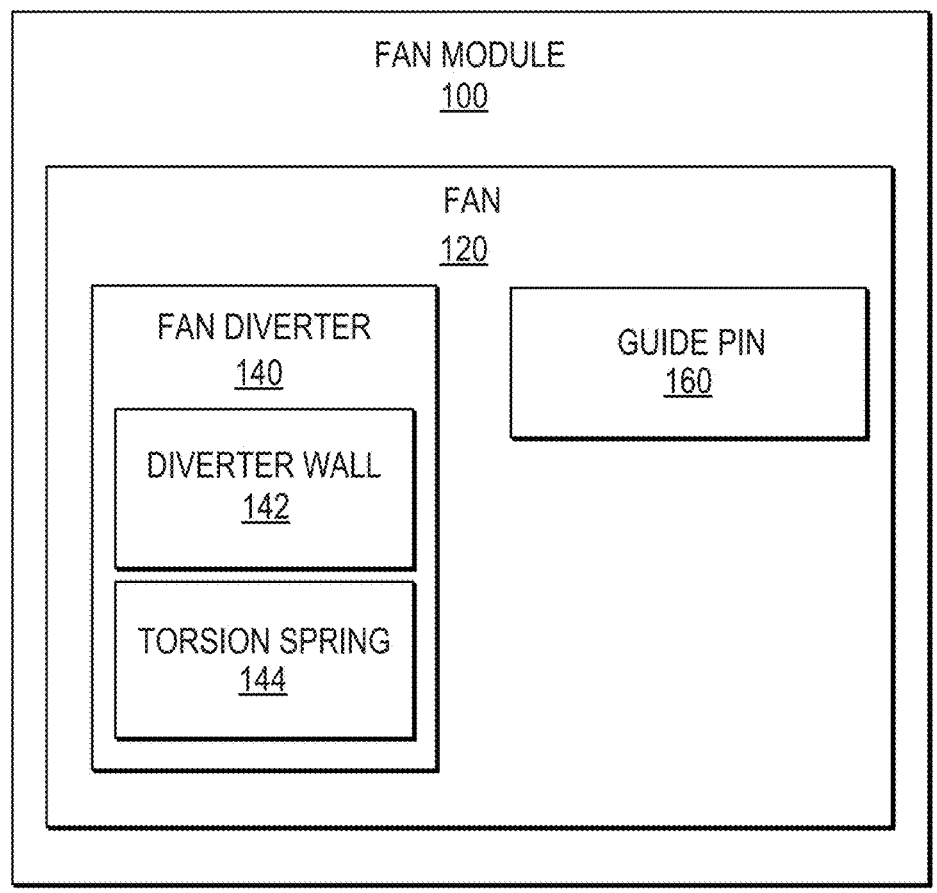
FIG. 1 illustrates a block diagram of a fan module according to an example.

FIG. 1 illustrates a block diagram of a fan module according to an example. The fan module 100 includes a fan 120, a fan diverter 140, and a guide pin 160. The fan 120 to provide air. The fan diverter 140 formed in the fan module 100. The fan diverter 140 includes a diverter wall 142 and a torsion spring 144. The diverter wall 142 to direct the air from the fan 120 towards an electronic system. The torsion spring 144 along the diverter wall 142 to provide an equilibrium position for the diverter wall 142. The guide pin 160 connected to the fan diverter 140, specifically, the diverter wall 142. The guide pin 160 formed to engage with a guide path formed along a chassis bay to determine the range of motion of the guide pin 160 and to position the diverter wall 142.

Figure 2:
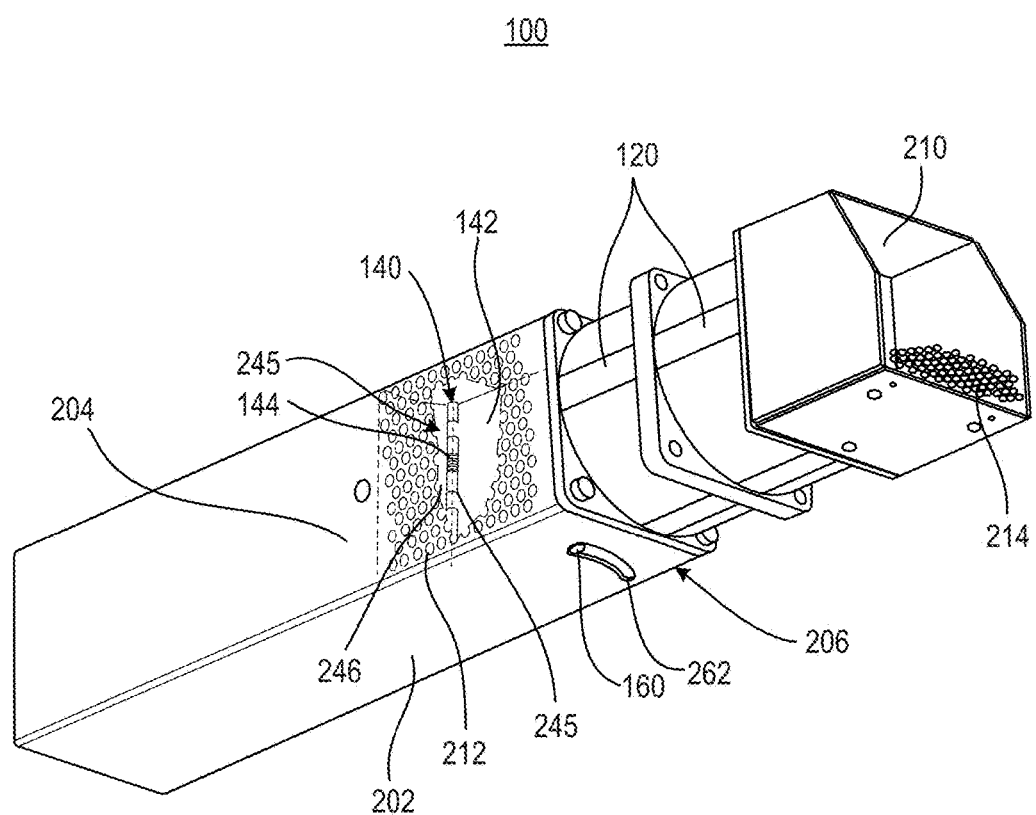
FIG. 2 illustrates a perspective diagram of the fan module of FIG. 1 according to an example.

FIG. 2 illustrates a perspective diagram of the fan module 100 of FIG. 1 according to an example. The fan module 100 illustrated includes an air inlet 210, two fans 120, the fan diverter 140, and the guide pin 160. The air inlet 210 is formed to receive air that the fans 120 circulate and provide to the electronic system with the air through the fan air holes 212 on the sides 204, 206 of the fan module 100. The air inlet 210 also includes a cooling system connection 214 formed to connect to an electronic system, for example, a printed circuit assembly (PCA). The electronic system to control the fan module 100, such as the speed of the fans 120 and the position of the fan diverter 140, such as the movement of the diverter wall 142. The cooling system connection 214 may also include a cable or a fixed connector that mate with an interconnect system in the chassis. The electronic system that controls the fan module may or may not be on the fan module.

The fan diverter 140 includes a diverter wall 142 connected to a fixed wall 246 via a hinged pin 248. The hinged pin 248 connects the diverter wall 142 at a pivot point 245 on the fan diverter 140. The hinged pin 248 connects to the torsion spring 144 to return the diverter wall 142 to an equilibrium position when not installed into the chassis to ensure correct alignment upon insertion into the chassis bay. For example, the torsion spring 144 provides a spring force that returns the diverter wall 142 to an equilibrium position. The torsion spring 144 also ensures that the diverter wall 142 does not vibrate or cause acoustic issues during operation.

The guide pin 160 may include a pin selected from a fixed pin and a spring loaded pin. The guide pin 160 extends from the diverter wall 142. The guide pin 160 may move along an arc-shaped rotation path 262 formed in the fan module 100 to enable rotation of the guide pin 160. The arc-shaped rotation path 262 is illustrated along a bottom portion 202 of the fan module 100; however, the arc-shaped rotation path 262 may also be formed along the top portion (not illustrated) of the fan module 100. The arc-shaped rotation path 262 enables the guide pin 160 to engage with the guide path formed in the chassis bay. The guide path to position the diverter wall 142 to direct air flow in one direction or a specific percent of air flow from zero percent to one hundred percent in one or multiple directions.

Figure 3:
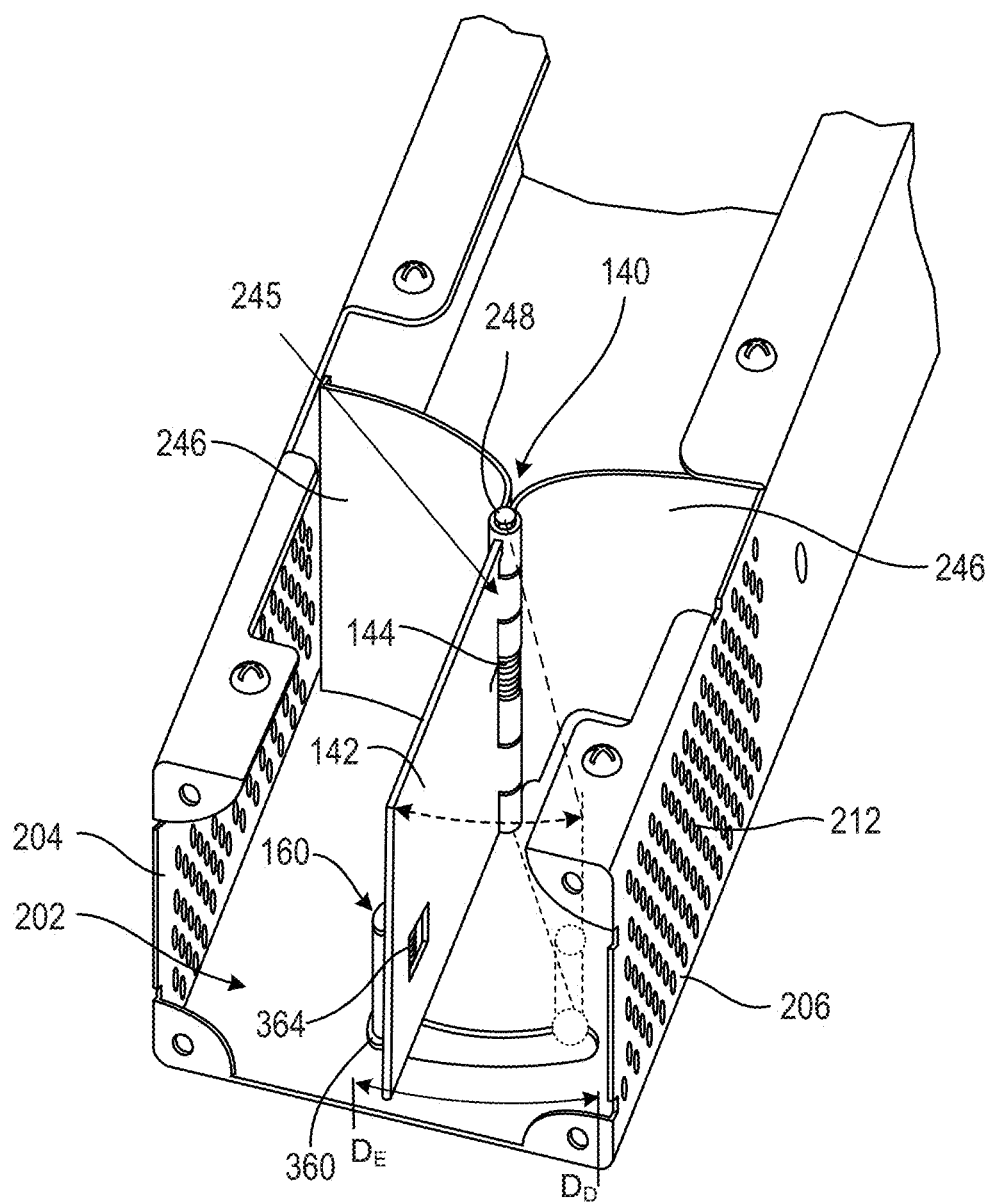
FIGS. 3-5 illustrate perspective diagrams of portions of the fan module of FIG. 1 according to examples.
Figure 4:
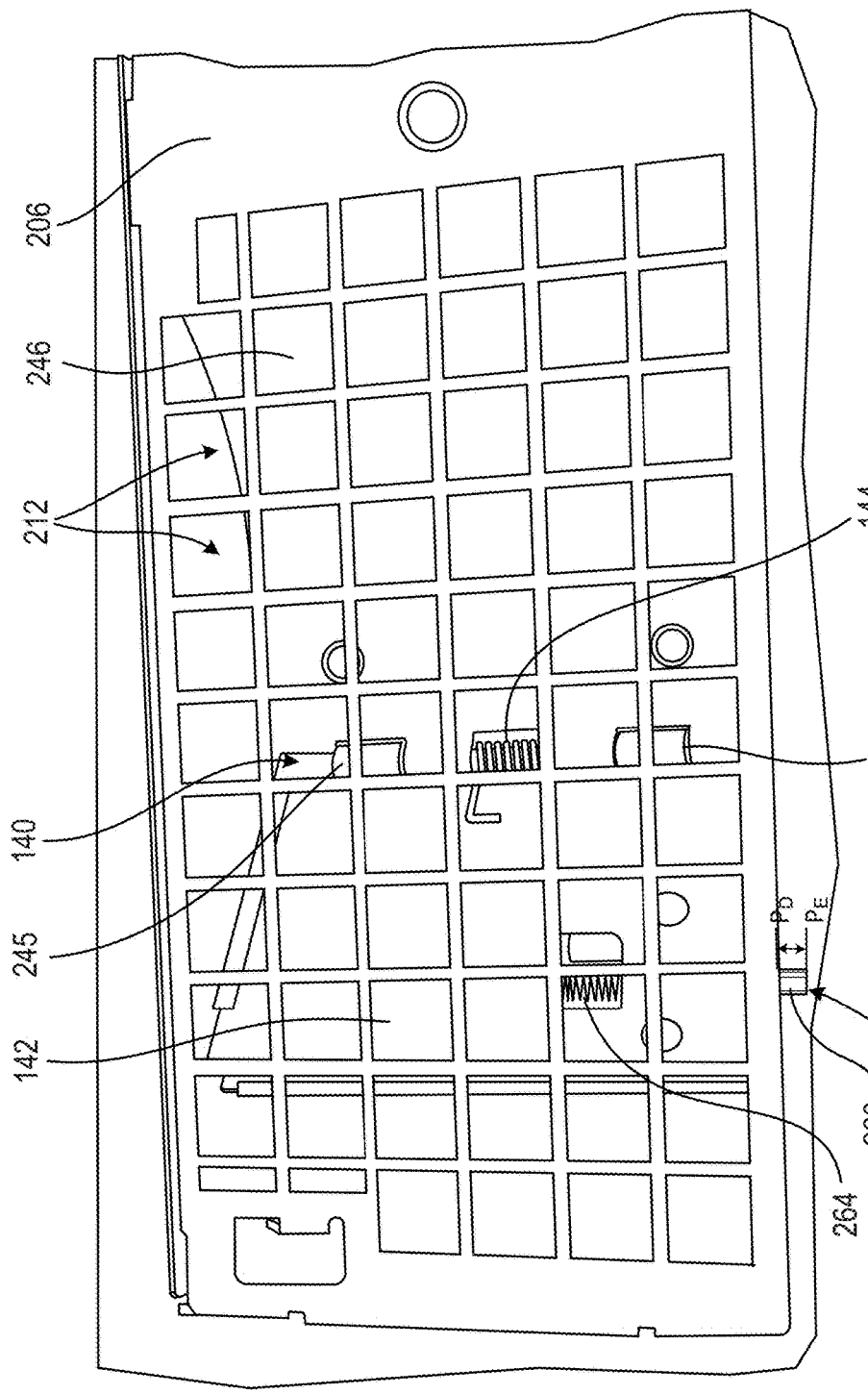
Figure 5:
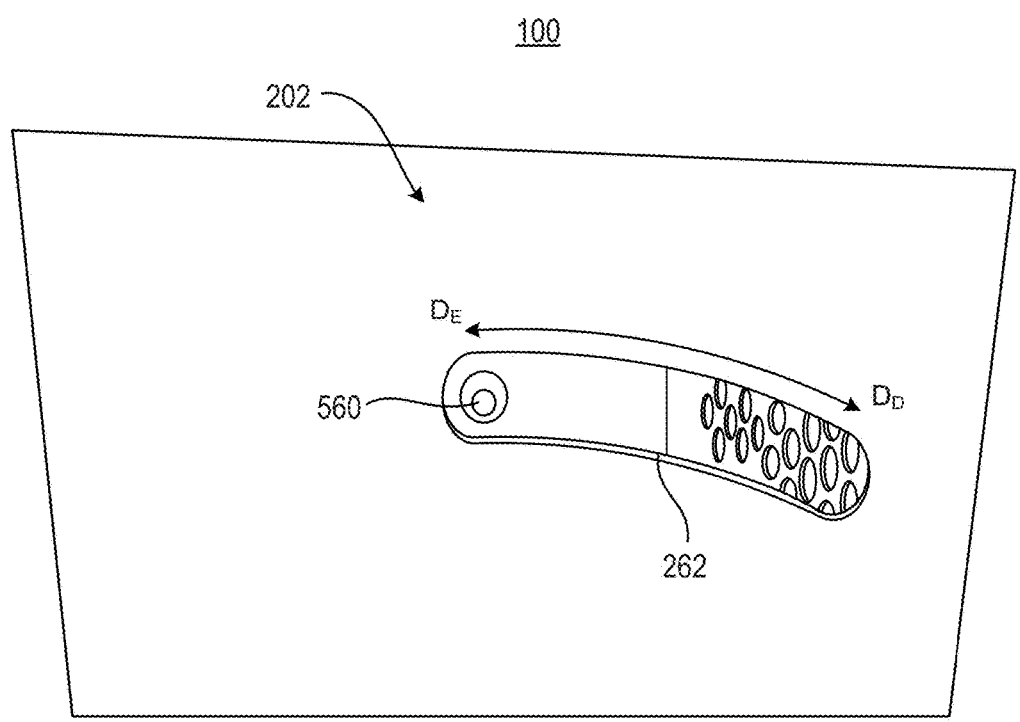

FIGS. 3-5 illustrate perspective diagrams of portions of the fan module 100 of FIG. 1 according to examples.

FIG. 3 illustrates a top view of the fan module 100. Referring to FIG. 3, the fan diverter 140 is illustrated with an example of the motion of the diverter wall 142. The arc-shaped rotation path 262 is illustrated along the bottom portion 202 of the fan module 100. The fan diverter 140 is illustrated as moving between an equilibrium position, $D_E$ and a displaced position, $D_D$. The torsion spring 144 to return the diverter wall 142 to the equilibrium position, $D_E$, upon removal of the fan module 100 from the chassis. The guide pin 160 is illustrated as a spring loaded pin 360 with a guide spring 364; however, rotation of a fixed pin and a spring loaded pin 360 would be the same.

FIG. 4 illustrates a side view of the side portion 206 of the fan module 100. The diverter wall 142 is illustrated in a displaced position, $D_D$ along the arc-shaped rotation path 262. The torsion spring 144 is further illustrated along the hinged pin 248 at the pivot point 245 of the fan diverter 140. The spring loaded pin 360 is illustrated as extending beyond the bottom portion 202 of the fan module 100. The spring loaded pin 360 moves between an equilibrium state $P_E$ to a displaced state $P_D$ to aid in insertion and removal of the fan module 100. The guide spring 364 of the spring loaded pin 360 is also illustrated. The guide spring 364 to provide the spring force to move the spring loaded pin 360 between the equilibrium state, $P_E$ and a displaced state, $P_D$.

FIG. 5 illustrates a bottom view of the bottom portion 202 of the fan module 100. The guide pin 160 extends from the diverter wall 142 and extends past the bottom portion 202 of the fan module 100 through the arc-shaped rotation path 262, which forms an opening for the guide pin 160, FIG. 5 illustrates the path of movement along the arc-shaped rotation path 262 between the equilibrium position, $D_E$ and a displaced position, $D_D$. The arc-shaped rotation path 262 may be used with a spring loaded pin 360 or a fixed pin 560. FIG. 5 illustrates use of a fixed pin 560.

Figure 6:
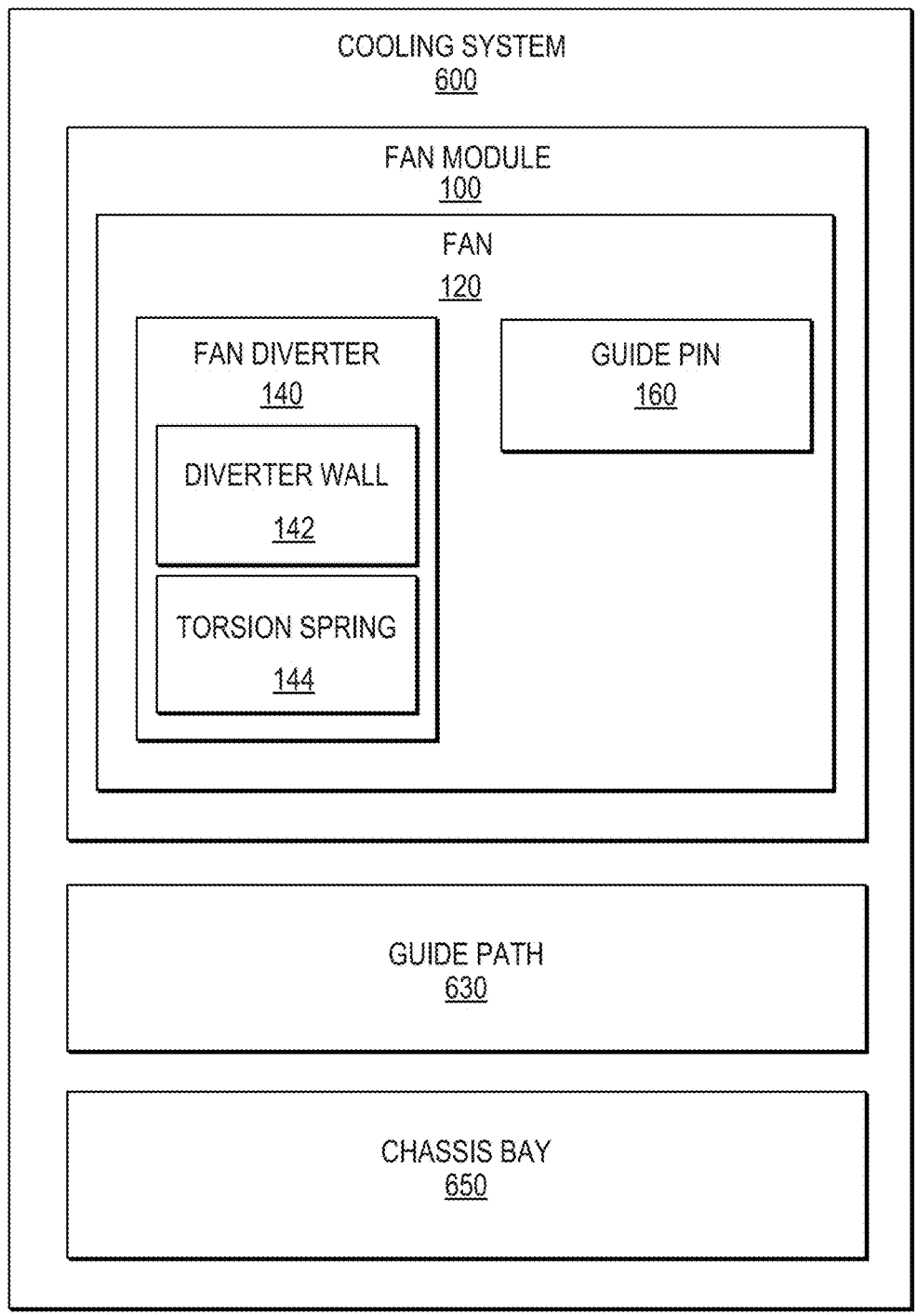
FIG. 6 illustrates a block diagram of a cooling system according to an example.

FIG. 6 illustrates a block diagram of a cooling system 600 according to an example. The cooling system 600 includes a fan module 100, a guide path 630, and a chassis bay 650 formed to receive the fan module 100 and the guide path 630.

The fan module 100 includes a fan 120, a fan diverter 140, and a guide pin 160. The fan 120 to provide air to an electronic system. The fan diverter 140 includes a diverter wall 142 formed to pivot around a pivot point and a torsion spring 144 connected to the pivot point 245 to provide a force to return the fan diverter 140 to an equilibrium position, $D_E$. For example, the pivot point 245 includes a hinged pin 248 connected to the diverter wall 142 that is formed to receive the torsion spring 144.

The guide pin 160 is attached to the diverter wall 142. The guide pin 160 is formed to engage with a guide path 630 formed along a chassis bay 650. The guide pin 160 to adjust the position of the diverter wall 142. The guide pin 160 includes, for example, a spring loaded pin 360 or a fixed pin 560. The fan module 100 may further include an arc-shaped rotation path 262 formed to engage with the guide pin 160 as the guide pin 160 moves along the guide path 630.

The guide path 630 to determine a range of motion for the guide pin 160, which positions the diverter wall 142. For example, the guide path 630 directs the guide pin 160 during insertion of the fan module 100 such that the diverter wall 142 is positioned at a specific angle to direct the air flow from the fan 120 towards the electronic system. For example, the guide path 630 to position the diverter wall 142 to direct air flow in one direction or a specific percent of air flow from zero percent to one hundred percent in one or multiple directions.

Figure 7:
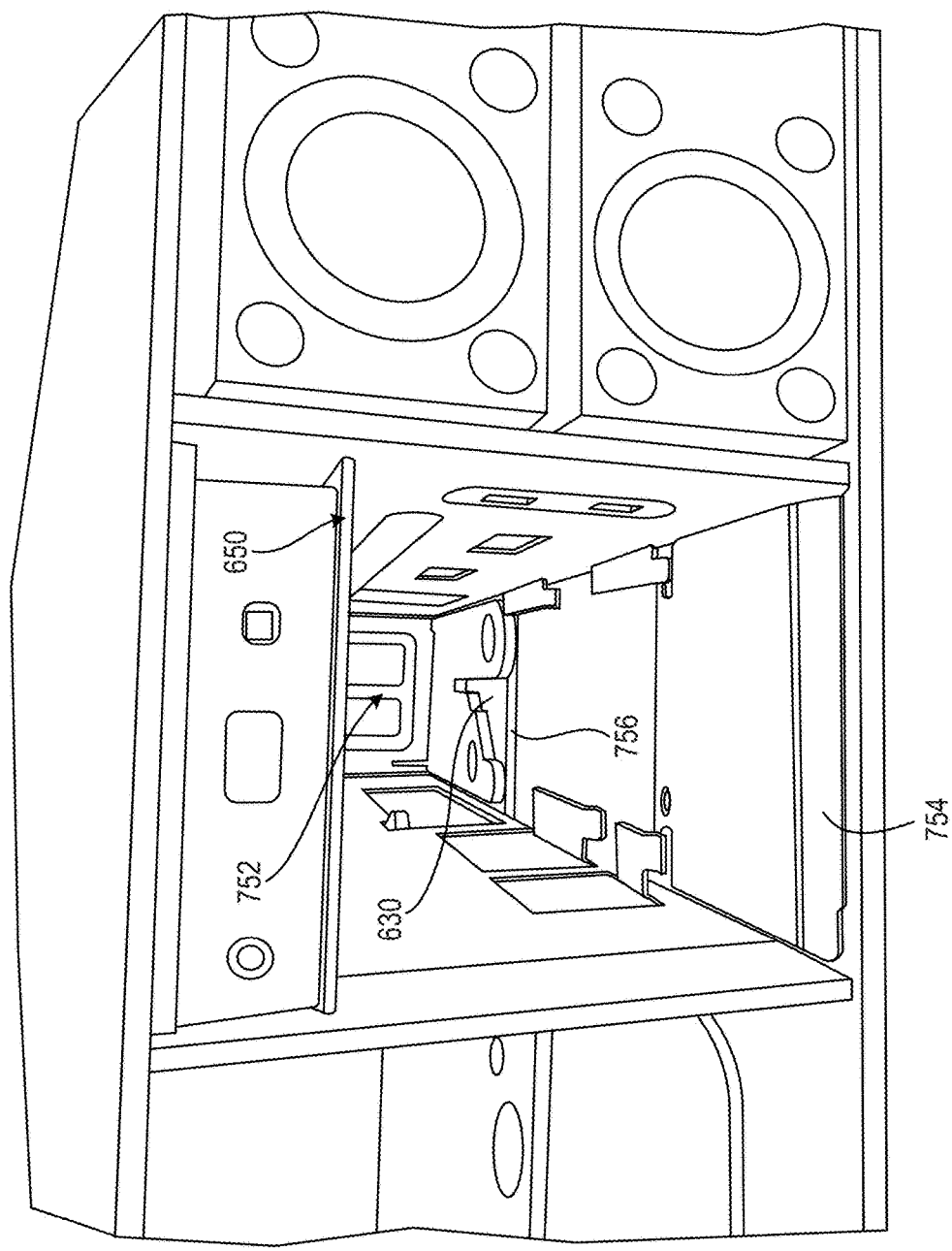
FIGS. 7-9 illustrate perspective diagrams of portions of the cooling system of FIG. 6 according to examples.
Figure 8:
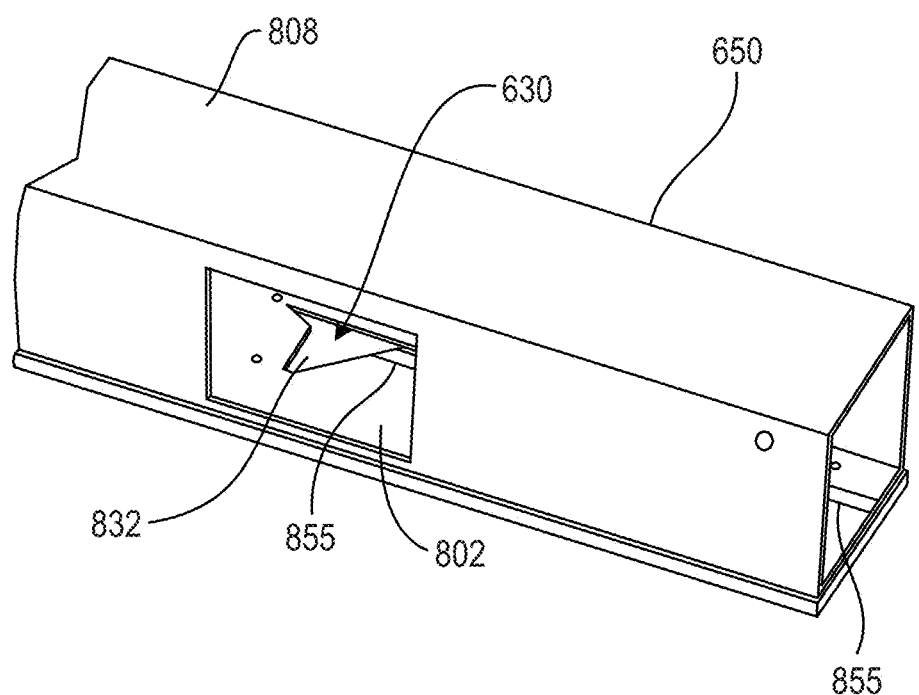
Figure 9:
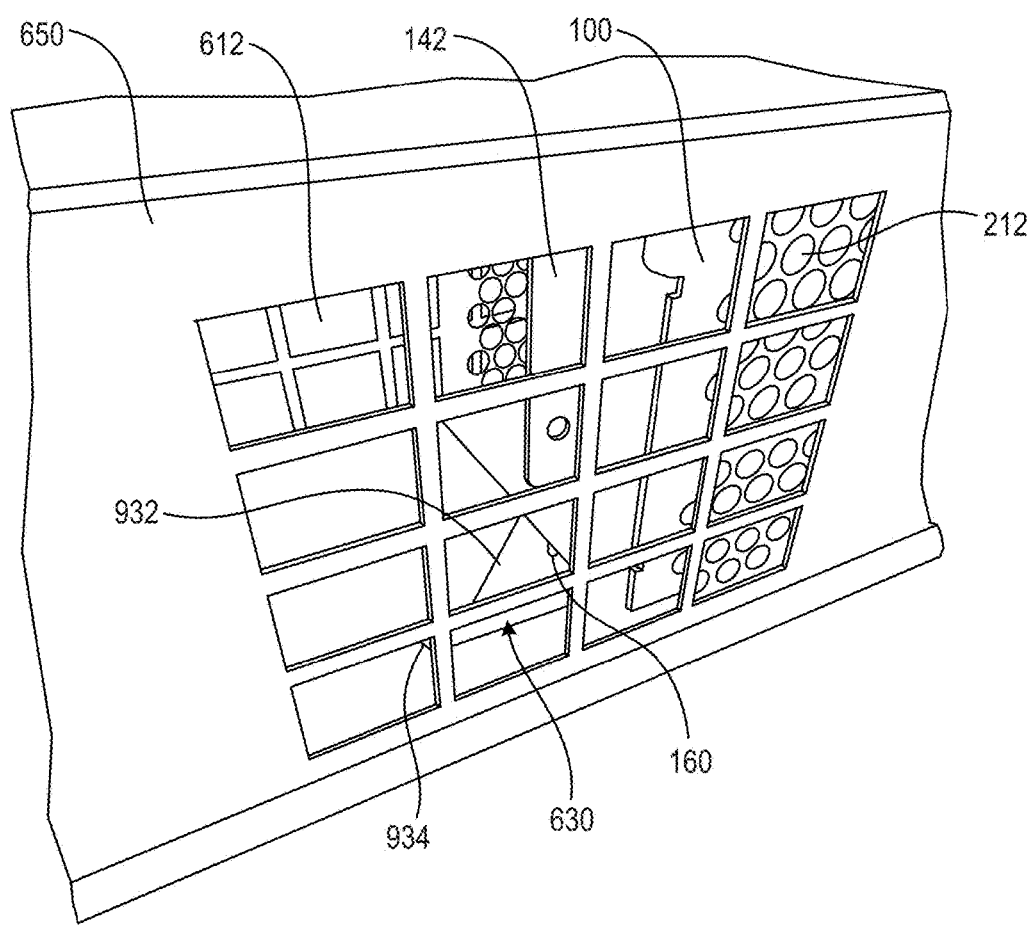

FIGS. 7-9 illustrate perspective diagrams of portions of the cooling system 600 of FIG. 6 according to examples. Referring to FIG. 7, a rear view of the chassis bay 650 is illustrated. The chassis bay 650 includes an opening 752 formed to receive the fan module 100. For example, the opening 752 has a bay ramp 754 and a guide path ramp 756 useable with a spring loaded pin 360. The bay ramp 654 to engage with a spring loaded pin 360 as the fan module 100 moves into and out of the chassis bay 650. Engagement of the spring loaded pin 360 with the bay ramp 754 displaces the spring loaded pin 360 or moves the spring loaded pin 360 from an equilibrium state $P_E$ to a displaced state $P_D$. The guide path ramp 756 to engage with the spring loaded pin 360 as the fan module 100 moves into and out of alignment with the guide path 630. Engagement of the spring loaded pin 360 with the guide path ramp 756 displaces the spring loaded pin 360 from an equilibrium state $P_E$ or moves the spring loaded pin 360 from an equilibrium state $P_E$ to a displaced state $P_D$.

Referring to FIG. 8, a side view of the chassis bay 650 is illustrated. The chassis bay 650 includes a groove 855 longitudinally along the chassis bay 650 that is formed to receive a fixed pin 560. The fixed pin 560 to move along the groove 855 as the fan module 100 is inserted into and/or removed from the chassis bay 650. The fixed pin 560 then engages with the guide path 630. The groove 855 to guide the fixed pin 560 as the fan module 100 moves into and out of the chassis bay 650 and into and out of alignment with the guide path 630.

Referring to FIG. 8, the guide path 630 comprises a predetermined path formed in an interchangeable member insertable into the chassis bay 650 at the bottom portion 802 or top portion 808 of the chassis bay 650. For example, the guide path 630 may be an interchangeable portion that is formed of a simple cutout 832 insertable into the floor or bottom portion 802 of the chassis bay 650. As design requirements change for cooling of the electronic system, instead of modifying a position of the diverter wall 142 in a fan module 100, the guide path 630 in the floor or bottom portion 802 of the chassis bay 650 may be modified in tool as using the simple cutout 832.

FIG. 9 illustrates a side view of the cooling system 600 with the fan module 100 partially inserted into the chassis bay 650. The diverter wall 142 is illustrated in an equilibrium position $D_E$. The diverter wall 142 to move along the guide path 630, such that as the guide pin 160 moves along the sloped or angled portion 932 and the guide pin 160 rotates to the angle predefined by the guide path 630. As the guide pin 160 moves along the angled portion 932, the guide pin 160 also rotates along the arc-shaped rotation path 262 and the diverter wall 142 rotates from the equilibrium position $D_E$ to a displaced position $D_D$. Once the fan module 100 is fully inserted, the guide pin 160 is positioned along the guide path 630 at an extension portion 934, where the guide pin 160 is positioned at an angle, predetermined by the guide path 630. The concept is the same for both the spring loaded pin 360 and the fixed pin 560. However, when the spring loaded pin 360 is used, the guide spring 364 will position the guide pin 160 in the equilibrium state $P_E$, to hold the diverter wall 142 in place. The air flow is directed by the diverter wall 142 and moves from the fan module 100 to the electronic system via fan air holes 212 in the fan module 100 and chassis air holes 912 in the chassis bay 650.

Figure 10:
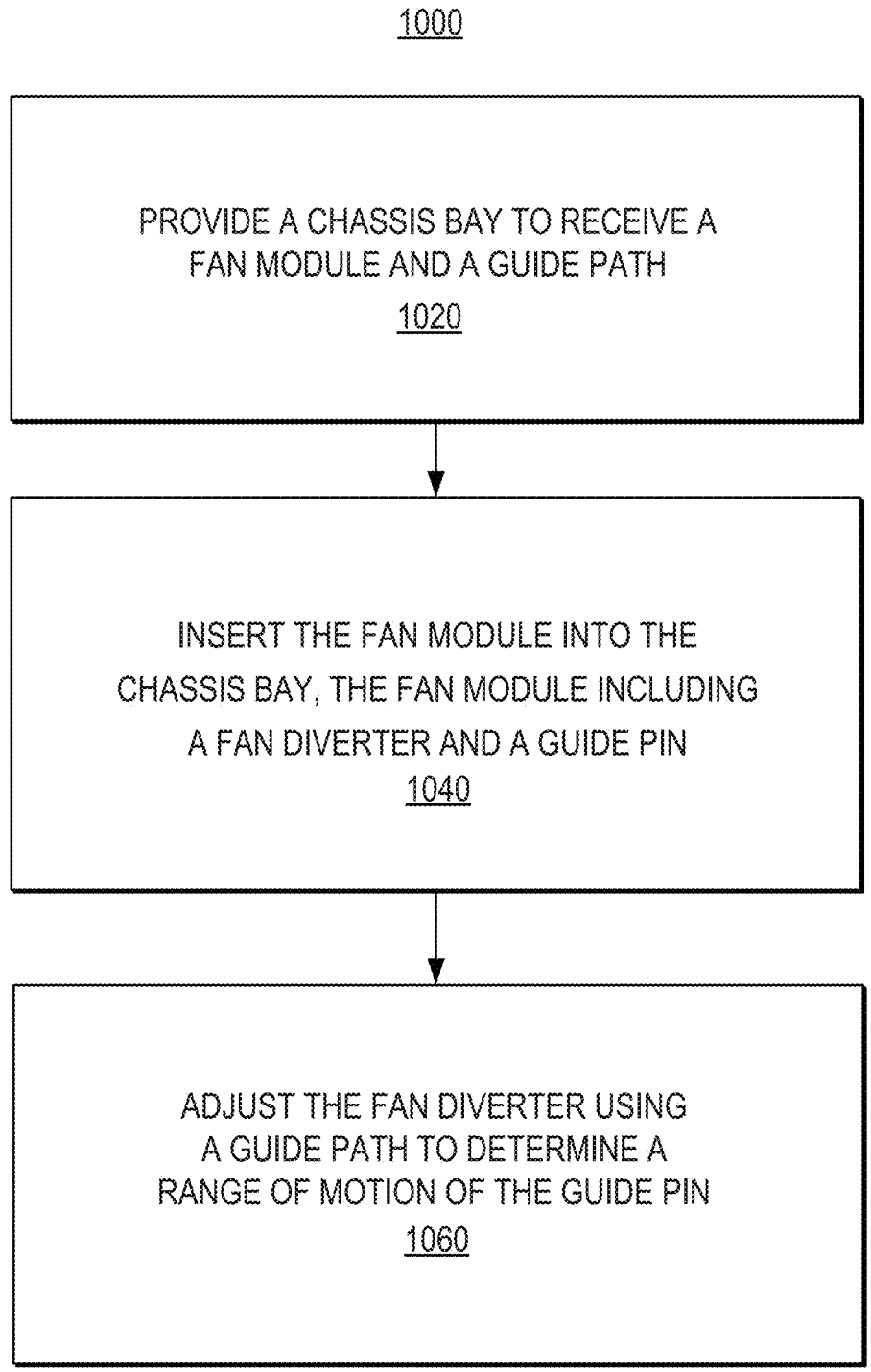
FIG. 10 illustrates a flow chart of a method to remove heat from n electronic device according to an example.

FIG. 10 illustrates a flow chart 1000 of a method to remove heat from an electronic device according to an example. In block 1020, a chassis bay is provided. The chassis bay is formed to receive a fan module and a guide path. The fan module is inserted into the chassis bay in block 1040. The fan module includes a fan diverter and a guide pin. The fan diverter includes a diverter wall, a pivot point, and a torsion spring. The diverter wall to direct the flow of air from a fan. The pivot point for a diverter wall to rotate about. The torsion spring to provide a force to return the fan diverter to an equilibrium position. The guide pin extends from the diverter wall to rotate the diverter wall along an arc-shaped rotation path formed in the fan module. The movement of the guide pin is determined by the guide path. In block 1060, the fan diverter adjusts using the guide path. The guide path to determine the range of motion of the guide pin and to position the diverter wall. The guide path to position the diverter wall to direct air flow in one direction or a specific percent of air flow from zero percent to one hundred percent in one or multiple directions.

Although the flow diagram of FIG. 10 illustrates specific orders of execution, the order of execution may differ from that which is illustrated. For example, the order of execution of the blocks may be scrambled relative to the order shown. Also, the blocks shown in succession may be executed concurrently or with partial concurrence. All such variations are within the scope of the present invention.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A fan module comprising:
a fan;
a fan diverter formed in the fan module, the fan diverter comprising a diverter wall and a torsion spring along the diverter wall to provide an equilibrium position for the diverter wall; and
a guide pin connected to the diverter wall, the guide pin formed to engage with a groove formed along a chassis bay that receives the guide pin and guides the guide pin as the fan moves into and out of the chasses bay.

2. The fan module of claim 1, wherein the guide pin comprises a pin selected from a fixed pin and a spring loaded pin.

3. The fan module of claim 1, further comprising an arc-shaped rotation path formed in the fan module to enable rotation of the guide pin therealong.

4. The fan module of claim 1, further comprising a hinged pin to connect the diverter wall at a pivot point, the hinged pin connected to the torsion spring to return the diverter wall to the equilibrium position.

5. The fan module of claim 1, wherein the torsion spring provides a spring force that returns the diverter wall to the equilibrium position.

6. A cooling system comprising:
a fan module that includes:
a fan,
a fan diverter including a diverter wall formed to pivot around a pivot point,
a guide pin attached to the diverter wall, the guide pin formed to engage with a guide path formed along a chassis bay, the guide pin to adjust the position of the diverter wall, and
a torsion spring connected to the pivot point to provide a force to return the fan diverter to an equilibrium position;
a guide path to determine a range of motion for the guide pin; and
a chassis bay formed to receive the fan module and the guide path, the chassis bay includes a bay ramp and a guide path ramp, the bay ramp to engage with the guide pin as the fan module moves into and out of the chassis bay, the guide path ramp to engage with the guide pin as the fan module moves into and out of alignment with the guide path.

7. The cooling system of claim 6, wherein the guide pin comprises a fixed pin.

8. The cooling system of claim 7, wherein the chassis bay further comprises a groove formed to receive the fixed pin, the groove to guide the fixed pin as the fan module moves into and out of the chassis bay.

9. The cooling system of claim 6, wherein the guide pin comprises a spring loaded pin.

10. The cooling system of claim 6, wherein engagement of the spring loaded pin with the bay ramp displaces the spring loaded pin.

11. The cooling system of claim 6, wherein the guide path comprises a predetermined path formed in an interchangeable member insertable into the chassis bay.

12. The cooling system of claim 6, wherein the pivot point comprises a hinged pin connected to the diverter wall, the hinged pin formed to receive the torsion spring.

13. The cooling system of claim 6, wherein the fan module further comprises an arc-shaped rotation path formed to engage with the guide pin as the guide pin moves along the guide path.

14. A method to remove heat from an electronic device comprising:
providing a chassis bay, the chassis bay formed to receive a fan module and a guide path;
inserting the fan module into the chassis bay, the fan module including:
a fan diverter includes a diverter wall to direct a flow of air from a fan, a pivot point for a diverter wall to rotate about, and a torsion spring to provide a force to return the diverter wall to an equilibrium position, and
a guide pin extending from the diverter wall to rotate the diverter wall along an arc-shaped rotation path formed in the fan module, the movement of the guide pin determined by the guide path; and
adjusting the fan diverter using the guide path to determine a range of motion of the guide pin and to position the diverter wall.

15. The method of claim 14, further comprising inserting an interchangeable member into the chassis bay to form a predetermined path for the guide path.

16. The method of claim 14, further comprising displacing the guide pin using a bay ramp on the chassis bay.

17. The method of claim 16, wherein the bay ramp engages with the guide pin as the fan module moves into and out of the chassis bay.

18. The method of claim 14, further comprising engaging the guide pin with a guide path ramp formed in the chassis bay as the fan module moves into and out of alignment with the guide path.

19. The method of claim 14, further comprising receiving the guide pin in a groove formed to receive the guide pin, the groove to guide the guide pin as the fan module moves into and out of the chassis bay.

* * * * *